US009557359B2

(12) United States Patent
Ishihara et al.

(10) Patent No.: US 9,557,359 B2
(45) Date of Patent: Jan. 31, 2017

(54) DEVICE, METHOD AND PROGRAM FOR DETERMINING MISPLACEMENT OF A CURRENT TRANSFORMER ON A POWER LINE

(71) Applicants: Masahiro Ishihara, Tokyo (JP); Satoshi Endo, Tokyo (JP); Yoshiaki Koizumi, Tokyo (JP); Shinsaku Kusube, Tokyo (JP); Masaki Takata, Tokyo (JP); Yoshihiro Taniguchi, Tokyo (JP)

(72) Inventors: Masahiro Ishihara, Tokyo (JP); Satoshi Endo, Tokyo (JP); Yoshiaki Koizumi, Tokyo (JP); Shinsaku Kusube, Tokyo (JP); Masaki Takata, Tokyo (JP); Yoshihiro Taniguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/765,198

(22) PCT Filed: Feb. 14, 2013

(86) PCT No.: PCT/JP2013/053486
§ 371 (c)(1),
(2) Date: Jul. 31, 2015

(87) PCT Pub. No.: WO2014/125590
PCT Pub. Date: Aug. 21, 2014

(65) Prior Publication Data
US 2015/0377939 A1 Dec. 31, 2015

(51) Int. Cl.
G01R 19/00 (2006.01)
G01R 25/00 (2006.01)
(Continued)

(52) U.S. Cl.
CPC ............ *G01R 25/005* (2013.01); *G01R 15/18* (2013.01); *G01R 29/18* (2013.01); *G01R 31/02* (2013.01)

(58) Field of Classification Search
CPC ... G01R 15/142; G01R 21/133; G01R 35/005; G01R 19/2513; G01R 21/00; G01R 15/18; G01R 21/06; G01R 31/085; G01R 22/063; G01R 23/02; G01R 25/00; G01R 31/02; G01R 19/00; G01R 31/021; G01R 31/08; G01R 31/086; G01R 19/155; G01R 19/252; G01R 22/068; G01R 35/04; H04L 25/0298; H04L 27/2071
See application file for complete search history.

(56) References Cited

U.S. PATENT DOCUMENTS 6,922,643 B2 * 7/2005 Takakamo ............ G01R 27/18
324/509
2005/0225909 A1 * 10/2005 Yoshizaki ............ H01H 83/144
361/42

FOREIGN PATENT DOCUMENTS

JP S59-58374 U 4/1984
JP 2000-258484 A 9/2000
(Continued)

OTHER PUBLICATIONS

International Search Report of the International Searching Authority mailed May 28, 2013 for the corresponding international application No. PCT/JP2013/053486 (and English translation).
Extended European Search Report dated Oct. 14, 2016 in the corresponding EP application No. 13875091.4.

*Primary Examiner* — Vinh Nguyen
(74) *Attorney, Agent, or Firm* — Posz Law Group, PLC

(57) ABSTRACT

A voltage/current verifier computes, for each phase, a phase difference between phase voltage and phase current from the phase of phase voltage and the phase of phase current computed for each phase by a phase acquirer, and deter- (Continued)

mines conformity if all of the computed phase differences are within a preset range. A current/current verifier computes phase differences between phase currents from the phase of phase current computed for each phase by the phase acquirer, and determines conformity if all of the computed phase differences are less than 180°. A reporting device reports that a current transformer is incorrectly placed on a power line unless both the voltage/current verifier and the current/current verifier do not determine conformity.

7 Claims, 9 Drawing Sheets

(51) Int. Cl.
 *G01R 29/18* (2006.01)
 *G01R 15/18* (2006.01)
 *G01R 31/02* (2006.01)

(56) References Cited

FOREIGN PATENT DOCUMENTS

| | | |
|---|---|---|
| JP | 2002-168883 A | 6/2002 |
| JP | 2002-286769 A | 10/2002 |
| JP | 2009-081905 A | 4/2009 |
| JP | 2010-256102 A | 11/2010 |

* cited by examiner

| PHASE VOLTAGE IMBALANCE | EFFECTIVE VALUE OF PHASE CURRENT Ia (A) | EFFECTIVE VALUE OF PHASE CURRENT Ib (A) | EFFECTIVE VALUE OF PHASE CURRENT Ic (A) |
|---|---|---|---|
| NONE | 6.7 | 6.4 | 6.5 |
| PHASE VOLTAGE Va IS +10% | 8.7 | 6.5 | 5.8 |
| PHASE VOLTAGE Va IS −10% | 2.8 | 11.2 | 10.8 |

FIG. 2A

| PHASE VOLTAGE IMBALANCE | PHASE DIFFERENCE BETWEEN VOLTAGE AND CURRENT, a PHASE (°) | PHASE DIFFERENCE BETWEEN VOLTAGE AND CURRENT, b PHASE (°) | PHASE DIFFERENCE BETWEEN VOLTAGE AND CURRENT, c PHASE (°) |
|---|---|---|---|
| NONE | −8.9 | −9.7 | −6.8 |
| PHASE VOLTAGE Va IS +10% | −6.2 | −40.6 | 29.9 |
| PHASE VOLTAGE Va IS −10% | 33.9 | 15.3 | −37.9 |

FIG. 2B

CASE OF UNIFORM PHASE VOLTAGES

| PLACEMENT OF CURRENT TRANSFORMER 12a | CORRECT PLACEMENT ON POWER LINE La | CORRECT PLACEMENT ON POWER LINE Lb | CORRECT PLACEMENT ON POWER LINE Lc | REVERSE PLACEMENT ON POWER LINE La | REVERSE PLACEMENT ON POWER LINE Lb | REVERSE PLACEMENT ON POWER LINE Lc |
|---|---|---|---|---|---|---|
| PHASE DIFFERENCE BETWEEN VOLTAGE AND CURRENT, a PHASE (°) | −8.9 | −129.7 | 113.2 | 171.1 | 50.3 | −66.8 |
| PHASE DIFFERENCE WITHIN SET RANGE? | ○ | × | × | × | × | × |

FIG. 4A

| PLACEMENT OF CURRENT TRANSFORMER 12b | CORRECT PLACEMENT ON POWER LINE La | CORRECT PLACEMENT ON POWER LINE Lb | CORRECT PLACEMENT ON POWER LINE Lc | REVERSE PLACEMENT ON POWER LINE La | REVERSE PLACEMENT ON POWER LINE Lb | REVERSE PLACEMENT ON POWER LINE Lc |
|---|---|---|---|---|---|---|
| PHASE DIFFERENCE BETWEEN VOLTAGE AND CURRENT, b PHASE (°) | 111.1 | −9.7 | −126.8 | −68.9 | 170.3 | 53.2 |
| PHASE DIFFERENCE WITHIN SET RANGE? | × | ○ | × | × | × | × |

FIG. 4B

| PLACEMENT OF CURRENT TRANSFORMER 12c | CORRECT PLACEMENT ON POWER LINE La | CORRECT PLACEMENT ON POWER LINE Lb | CORRECT PLACEMENT ON POWER LINE Lc | REVERSE PLACEMENT ON POWER LINE La | REVERSE PLACEMENT ON POWER LINE Lb | REVERSE PLACEMENT ON POWER LINE Lc |
|---|---|---|---|---|---|---|
| PHASE DIFFERENCE BETWEEN VOLTAGE AND CURRENT, b PHASE (°) | −128.9 | 110.3 | −6.8 | 51.1 | −69.7 | 173.2 |
| PHASE DIFFERENCE WITHIN SET RANGE? | × | × | ○ | × | × | × |

FIG. 4C

CASE OF 10% LARGER PHASE VOLTAGE Va

| PLACEMENT OF CURRENT TRANSFORMER 12a | CORRECT PLACEMENT ON POWER LINE La | CORRECT PLACEMENT ON POWER LINE Lb | CORRECT PLACEMENT ON POWER LINE Lc | REVERSE PLACEMENT ON POWER LINE La | REVERSE PLACEMENT ON POWER LINE Lb | REVERSE PLACEMENT ON POWER LINE Lc |
|---|---|---|---|---|---|---|
| PHASE DIFFERENCE BETWEEN VOLTAGE AND CURRENT, a PHASE (°) | -6.2 | -160.6 | 149.9 | 173.8 | 19.4 | -30.1 |
| PHASE DIFFERENCE WITHIN SET RANGE? | ○ | × | × | × | ○ | ○ |

FIG. 5A

| PLACEMENT OF CURRENT TRANSFORMER 12b | CORRECT PLACEMENT ON POWER LINE La | CORRECT PLACEMENT ON POWER LINE Lb | CORRECT PLACEMENT ON POWER LINE Lc | REVERSE PLACEMENT ON POWER LINE La | REVERSE PLACEMENT ON POWER LINE Lb | REVERSE PLACEMENT ON POWER LINE Lc |
|---|---|---|---|---|---|---|
| PHASE DIFFERENCE BETWEEN VOLTAGE AND CURRENT, b PHASE (°) | 113.8 | -40.6 | -90.1 | -66.2 | 139.4 | 89.9 |
| PHASE DIFFERENCE WITHIN SET RANGE? | × | ○ | × | × | × | × |

FIG. 5B

| PLACEMENT OF CURRENT TRANSFORMER 12c | CORRECT PLACEMENT ON POWER LINE La | CORRECT PLACEMENT ON POWER LINE Lb | CORRECT PLACEMENT ON POWER LINE Lc | REVERSE PLACEMENT ON POWER LINE La | REVERSE PLACEMENT ON POWER LINE Lb | REVERSE PLACEMENT ON POWER LINE Lc |
|---|---|---|---|---|---|---|
| PHASE DIFFERENCE BETWEEN VOLTAGE AND CURRENT, b PHASE (°) | -126.2 | 79.4 | 29.9 | 53.8 | -100.6 | -150.1 |
| PHASE DIFFERENCE WITHIN SET RANGE? | × | × | ○ | × | × | × |

FIG. 5C

CASE OF 10% SMALLER PHASE VOLTAGE Va

| PLACEMENT OF CURRENT TRANSFORMER 12a | CORRECT PLACEMENT ON POWER LINE La | CORRECT PLACEMENT ON POWER LINE Lb | CORRECT PLACEMENT ON POWER LINE Lc | REVERSE PLACEMENT ON POWER LINE La | REVERSE PLACEMENT ON POWER LINE Lb | REVERSE PLACEMENT ON POWER LINE Lc |
|---|---|---|---|---|---|---|
| PHASE DIFFERENCE BETWEEN VOLTAGE AND CURRENT, a PHASE (°) | 33.9 | −104.7 | 82.1 | −146.1 | 75.3 | −97.9 |
| PHASE DIFFERENCE WITHIN SET RANGE? | ○ | × | × | × | × | × |

FIG. 6A

| PLACEMENT OF CURRENT TRANSFORMER 12b | CORRECT PLACEMENT ON POWER LINE La | CORRECT PLACEMENT ON POWER LINE Lb | CORRECT PLACEMENT ON POWER LINE Lc | REVERSE PLACEMENT ON POWER LINE La | REVERSE PLACEMENT ON POWER LINE Lb | REVERSE PLACEMENT ON POWER LINE Lc |
|---|---|---|---|---|---|---|
| PHASE DIFFERENCE BETWEEN VOLTAGE AND CURRENT, b PHASE (°) | 153.9 | 15.3 | −157.9 | −26.1 | −164.7 | 22.1 |
| PHASE DIFFERENCE WITHIN SET RANGE? | × | ○ | × | ○ | × | ○ |

FIG. 6B

| PLACEMENT OF CURRENT TRANSFORMER 12c | CORRECT PLACEMENT ON POWER LINE La | CORRECT PLACEMENT ON POWER LINE Lb | CORRECT PLACEMENT ON POWER LINE Lc | REVERSE PLACEMENT ON POWER LINE La | REVERSE PLACEMENT ON POWER LINE Lb | REVERSE PLACEMENT ON POWER LINE Lc |
|---|---|---|---|---|---|---|
| PHASE DIFFERENCE BETWEEN VOLTAGE AND CURRENT, b PHASE (°) | −86.1 | 135.3 | −37.9 | 93.9 | −44.7 | 142.1 |
| PHASE DIFFERENCE WITHIN SET RANGE? | × | × | ○ | × | ○ | × |

CASE OF 10% SMALLER PHASE VOLTAGE Va

| PLACEMENT OF CURRENT TRANSFORMER 12a | PLACEMENT OF CURRENT TRANSFORMER 12b | PLACEMENT OF CURRENT TRANSFORMER 12c | PHASE DIFFERENCE OF FUNDAMENTAL BETWEEN Ia AND Ib (°) | PHASE DIFFERENCE OF FUNDAMENTAL BETWEEN Ib AND Ic (°) | PHASE DIFFERENCE OF FUNDAMENTAL BETWEEN Ic AND Ia (°) | ALL PHASE DIFFERENCES LESS THAN 180°? |
|---|---|---|---|---|---|---|
| CORRECT PLACEMENT ON POWER LINE La | CORRECT PLACEMENT ON POWER LINE Lb | CORRECT PLACEMENT ON POWER LINE Lc | 138.6 | 173.2 | 48.2 | ○ |
| CORRECT PLACEMENT ON POWER LINE La | REVERSE PLACEMENT ON POWER LINE Lc | REVERSE PLACEMENT ON POWER LINE Lb | 131.8 | 186.8 | 41.4 | × |

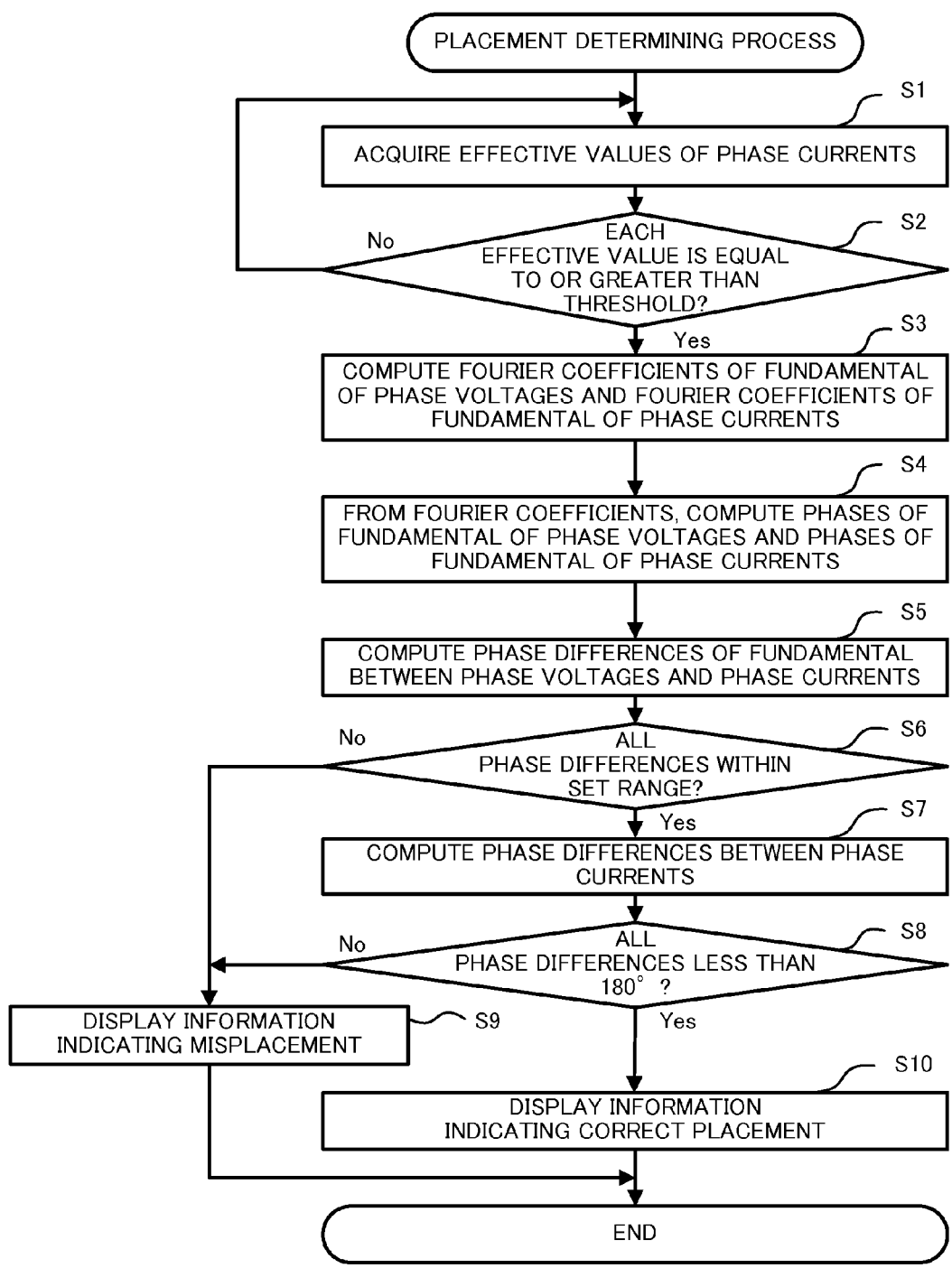

DEVICE, METHOD AND PROGRAM FOR DETERMINING MISPLACEMENT OF A CURRENT TRANSFORMER ON A POWER LINE

CROSS REFERENCE TO RELATED APPLICATION

This application is a U.S. national stage application of International Patent Application No. PCT/JP2013/053486 filed on Feb. 14, 2013, the contents of which are incorporated herein by reference.

TECHNICAL FIELD

The present disclosure relates to a determining device, a determining method, and a program.

BACKGROUND

The connection state detecting device described in Patent Literature 1 is known as a device that measures alternating current (AC) power supplied to a load via a power line from a three-phase AC power source. The connection state detecting device makes a determination as follows to determine whether or not the connection of alligator clips (terminals) connected to a power line for measuring phase voltage, and the placement of a clamp sensor (current transformer) placed on the outer circumference of a power line for measuring phase current, are incorrect.

The connection state detecting device determines, from the phase voltage measured via the terminals, whether or not the effective value of the phase voltage is within a designated range, and whether or not the phase sequence is a predetermined sequence. In addition, the connection state detecting device determines, from the phase voltage measured via the terminals and the phase current measured via the current transformer, whether or not the phase difference between the phase voltage and the phase current for each phase is within a predetermined range, and whether or not the phase voltage or the phase current has no input.

The connection state detecting device determines that the terminal connection or the current transformer placement is incorrect in the case of any of when the effective value of the phase voltage is outside a designated range, when the phase sequence differs from a predetermined sequence, when the phase difference between the phase voltage and the phase current for each phase is outside a predetermined range, and when the phase voltage or the phase current has no input.

PATENT LITERATURE

Patent Literature 1: Unexamined Japanese Patent Application Kokai Publication No. 2000-258484

The primary conductor (primary side) of a current transformer used in a connection state detecting device must be placed on the correct power line and also in the correct orientation with respect to the current flowing through the power line. This is because if the current transformer is placed on an incorrect power line, the phase difference computed by the connection state detecting device (the phase difference between the phase voltage and the phase current) will not indicate a correct value. In addition, if the current transformer is placed in the reverse orientation with respect to the current flowing through the power line, the phase of the phase current computed by the connection state detecting device will become the reverse phase compared to the phase of the phase current when the current transformer is placed in the correct orientation.

Also, the phase voltage that the connection state detecting device measures via the terminals must be uniform when the terminals are all correctly connected to the power line. This is because if the phase voltage is imbalanced, the phase difference computed by the connection state detecting device (the phase difference between the phase voltage and the phase current) will not indicate a correct value.

Specifically, when the phase voltage is uniform, the value of the phase current is nearly uniform. However, if a first phase voltage is 10% smaller than another phase voltage (the case of a −10% voltage imbalance from the first phase voltage), for example, the value of the first phase current decreases compared to when the phase voltage is uniform. Also, in the above case, the phase of the second phase current and the phase of the third phase current indicate change so that the sum of the vectors of the second phase current and the third phase current (the resultant vector) becomes zero. Thus, even if the current transformer is misplaced in the reverse orientation on the power line, the phase difference computed by the connection state detecting device lies within the predetermined range.

In this way, when the phase voltage measured by the connection state detecting device is imbalanced, depending on the power factor of the load connected to the three-phase AC power source, in some cases the phase difference computed by the connection state detecting device lies within the predetermined range, even if the current transformer is misplaced in the reverse orientation on the power line. In this case, the connection state detecting device determines that the phase difference between the phase current and the phase voltage for each phase is within the predetermined range. Furthermore, since the terminals are all correctly connected, the connection state detecting device determines that there are no problems with any of the other determinations (whether or not the effective value of the phase voltage is within a predetermined range, whether or not the phase sequence is a predetermined sequence, and whether or not the phase current or the phase voltage has no input). As a result, the connection state detecting device determines that the terminal connection and the current transformer placement are correct.

In this way, in a connection state detecting device, when there is an imbalance in the phase voltage measured via terminals correctly connected to a power line, there is a problem in that the connection state detecting device may be unable to determine misplacement even if the current transformer is misplaced in the reverse orientation on the power line.

SUMMARY

The present disclosure, being devised in light of the above circumstances, takes as an objective to provide a determining device, a determining method, and a program capable of determining misplacement if a current transformer is misplaced on a power line.

To achieve the above objective, a voltage measuring instrument of a determining device according to the present disclosure is configured to measure phase voltages applied to power lines configured to transmit alternating current power supplied from a three-phase alternating current power source. A current measuring instrument is configured to measure phase currents flowing through the power lines, via current transformers disposed on outer circumferences of the power lines. A phase acquirer is configured to compute, for each phase, a phase of phase voltage and a phase of phase current from the phase voltages measured by the voltage measuring instrument and the phase currents measured by the current measuring instrument. A voltage/current verifier is configured to compute, for each phase, a phase difference between phase voltage and phase current from the phase of phase voltage and the phase of phase current computed for each phase by the phase acquirer, and determine conformity if all of the computed phase differences are within a preset range. A current/current verifier is configured to compute phase differences between phase currents from the phase of phase current computed for each phase by the phase acquirer, and determine conformity if all of the computed phase differences are less than 180°. A reporting device is configured to report that the current transformer is incorrectly placed on the power line unless both the voltage/current verifier and the current/current verifier determine conformity.

According to the present disclosure, misplacement may be determined if a current transformer is misplaced on a power line, even if the phase voltage is imbalanced.

BRIEF DESCRIPTION OF DRAWINGS

FIG. 2A is a diagram illustrating effective values of phase current computed by a power measuring device, while FIG. 2B is a diagram illustrating phase differences between phase voltage and phase current, computed by a power measuring device;

FIG. 4A is a diagram illustrating phase differences between phase voltage and phase current as well as determination results for an a phase when the respective phase voltages are uniform, while FIG. 4B is a diagram illustrating phase differences between phase voltage and phase current as well as determination results for a b phase when the respective phase voltages are uniform, and FIG. 4C is a diagram illustrating phase differences between phase voltage and phase current as well as determination results for a c phase when the respective phase voltages are uniform;

FIG. 5A is a diagram illustrating phase differences between phase voltage and phase current as well as determination results for an a phase when the phase voltage of the a phase is 10% greater than the other phase voltages, while FIG. 5B is a diagram illustrating phase differences between phase voltage and phase current as well as determination results for a b phase when the phase voltage of the b phase is 10% greater than the other phase voltages, and FIG. 5C is a diagram illustrating phase differences between phase voltage and phase current as well as determination results for a c phase when the phase voltage of the c phase is 10% greater than the other phase voltages;

FIG. 6A is a diagram illustrating phase differences between phase voltage and phase current as well as determination results for an a phase when the phase voltage of the a phase is 10% smaller than the other phase voltages, while FIG. 6B is a diagram illustrating phase differences between phase voltage and phase current as well as determination results for a b phase when the phase voltage of the b phase is 10% smaller than the other phase voltages, and FIG. 6C is a diagram illustrating phase differences between phase voltage and phase current as well as determination results for a c phase when the phase voltage of the c phase is 10% smaller than the other phase voltages;

FIG. 8 is a diagram illustrating phase differences between phase currents as well as determination results when the phase voltage of an a phase is 10% smaller than the other phase voltages; and FIG. 9 is a flowchart illustrating a placement determining process.

DETAILED DESCRIPTION

Hereinafter, a power measuring device (determining device) 10 according to an embodiment of the present disclosure will be described with reference to FIGS. 1 to 9. The power measuring device 10 determines misplacement if a current transformer is misplaced on a power line, even if the measured phase voltage is imbalanced.

Figure 1:
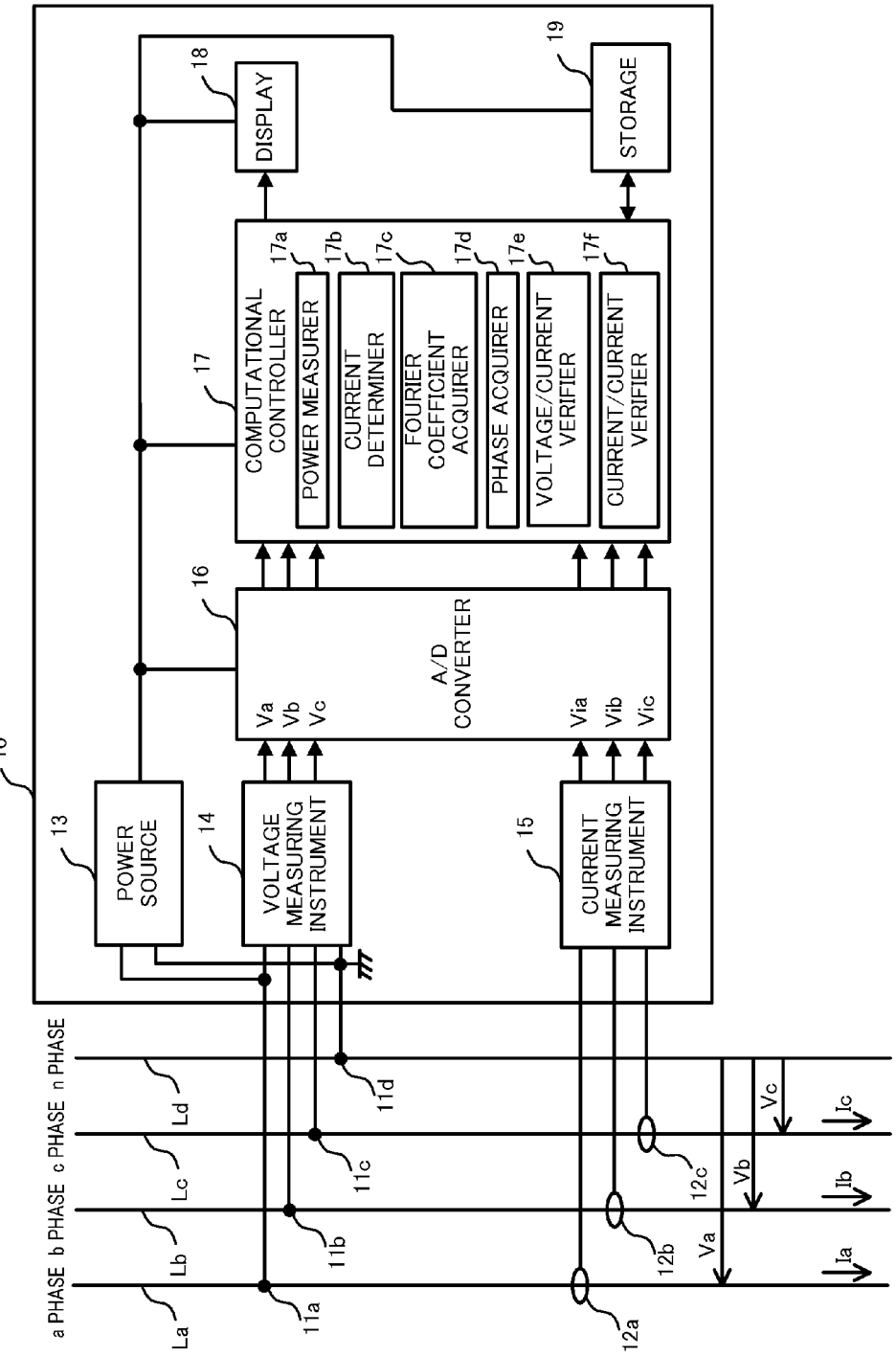
FIG. 1 is a block diagram of a power measuring device according to an embodiment of the present disclosure.

As illustrated in FIG. 1, the power measuring device 10 measures the values of AC power supplied to a load via power lines La to Lc connected to each phase of a three-phase, four-wire power source in a Y configuration.

Power lines La to Ld send AC power supplied from the three-phase, four-wire power source.

The power line La is connected to an a phase of the three-phase, four-wire power source. A phase voltage Va is applied to the power line La. Also, a phase current Ia flows through the power line La.

The power line Lb is connected to a b phase of the three-phase, four-wire power source. A phase voltage Vb is applied to the power line Lb. Also, a phase current Ib flows through the power line Lb.

The power line Lc is connected to a c phase of the three-phase, four-wire power source. A phase voltage Vc is applied to the power line Lc. Also, a phase current Ic flows through the power line Lc.

The power line Ld is connected to the ground of the power measuring device 10. A voltage that acts as a reference voltage for the phase voltages Va to Vc applied to the power lines La to Lc is applied to the power line Ld.

The power measuring device 10 is equipped with voltage terminals 11a to 11d, current transformers 12a to 12c, a power source 13, a voltage measuring instrument 14, a current measuring instrument 15, an A/D converter 16, a computational controller 17, a display 18, and storage 19.

The voltage terminals 11a to 11d are used to measure the phase voltages Va to Vc applied to the power lines La to Lc. The voltage terminal 11a is connected to the power line La. The voltage terminal 11b is connected to the power line Lb. The voltage terminal 11c is connected to the power line Lc. The voltage terminal 11d is connected to the power line Ld. In the present embodiment, there are no incorrect connections of the voltage terminals 11a to 11d, and the voltage terminals 11a to 11d are correctly connected to the power lines La to Ld.

The current transformers 12a to 12c are used to measure the phase currents Ia to Ic flowing through the power lines La to Lc. The current transformers 12a to 12c are ring-type current transformers having a primary conductor and a secondary conductor. The current transformers 12a to 12c are placed in a state enclosing the outer circumference of the power lines La to Lc, respectively.

The current transformers 12a to 12c produce a current in the secondary conductor (secondary side) corresponding to the phase currents Ia to Ic flowing through the power lines La to Lc, and output to the current measuring instrument 15.

The current transformers 12a to 12c must be placed in the correct orientation with respect to the phase currents Ia to Ic. This is because placing the current transformers 12a to 12c in the reverse orientation with respect to the phase currents Ia to Ic results in the reverse phase with respect to the AC current of the correct orientation, and the power measuring device 10 is unable to correctly compute the AC power.

The power source 13 converts AC power supplied from the three-phase, four-wire power source into direct current (DC) power, and supplies the converted DC power to each of the components 16 to 19. Of the two input terminals of the power source 13, one input terminal is connected to the power line La, while the other input terminal is connected to the power line Ld. The power source 13 rectifies the input phase voltage Va using a diode, for example, lowers the voltage with a DC-DC converter or the like, and converts AC power to DC power.

The voltage measuring instrument 14 has four input terminals. The input terminals are connected to the voltage terminals 11a to 11d, respectively. The voltage measuring instrument 14 has three output terminals. The output terminals are respectively connected to the input terminals of the A/D converter 16.

When the voltage terminals 11a to 11d are connected to the power lines La to Ld, the voltage measuring instrument 14 measures the voltage applied to the power lines La to Ld.

The voltage measuring instrument 14 measures a phase voltage Va from the voltage applied to the power line La and the voltage applied to the power line Ld. The voltage measuring instrument 14 measures a phase voltage Vb from the voltage applied to the power line Lb and the voltage applied to the power line Ld. The voltage measuring instrument 14 measures a phase voltage Vc from the voltage applied to the power line Lc and the voltage applied to the power line Ld.

The voltage measuring instrument 14 divides the measured phase voltages Va to Vc, and lowers the phase voltages Va to Vc down to an amplitude that may be input into the A/D converter 16. The voltage measuring instrument 14 outputs the lowered phase voltages Va to Vc to the A/D converter 16.

The current measuring instrument 15 is made up of the load resistors of the current transformers 12a to 12c, for example, and has three input terminals. The input terminals are connected to the secondary conductors of the current transformers 12a to 12c, respectively. The current measuring instrument 15 has three output terminals. The output terminals are respectively connected to the input terminals of the A/D converter 16.

When the current transformers 12a to 12c are placed on the power lines La to Lc, the current measuring instrument 15 outputs a voltage proportional to the phase currents Ia to Ic flowing through the power lines La to Lc.

The current measuring instrument 15 generates a converted voltage Via indicating a value corresponding to the value of the phase current Ia, a converted voltage Vib indicating a value corresponding to the value of the phase current Ib, and a converted voltage Vic indicating a value corresponding to the value of the phase current Ic.

The current measuring instrument 15 outputs the converted voltages Via to Vic to the A/D converter 16.

The A/D converter 16 is a delta-sigma A/D converter that performs delta-sigma modulation, for example. The A/D converter 16 has six input terminals. Three of the input terminals are connected to the output terminals of the voltage measuring instrument 14. The remaining three input terminals are connected to the output terminals of the current measuring instrument 15. The A/D converter 16 has six output terminals. The output terminals are all connected to the input terminals of the computational controller 17.

The A/D converter 16 acquires the lowered phase voltages Va to Vc output from the voltage measuring instrument 14, converts the values (analog values) of the acquired phase voltages Va to Vc into digital values, and outputs to the computational controller 17. The A/D converter 16 acquires the converted voltages Via to Vic output from the current measuring instrument 15, converts the values (analog values) of the acquired converted voltages Via to Vic into digital values, and outputs to the computational controller 17.

The A/D converter 16 executes sampling that converts from analog values to digital values, in accordance with a trigger signal output from the computational controller 17 to the A/D converter 16.

The sampling of the phase voltage Va and the converted voltage Via, the sampling of the phase voltage Vb and the converted voltage Vib, and the sampling of the phase voltage Vc and the converted voltage Vic are conducted accurately at the same time in coordination with respective trigger signals. When the phases of the converted voltages Via to Vic are advanced with respect to the phases of the phase voltages Va to Vc due to the characteristics of the current transformers 12a to 12c, the trigger signals may be adjusted so that the sampling timings of the phase voltages Va to Vc occur earlier than the sampling timings of the phase voltages Va to Vc by an amount of time equal to the phase advancement.

The digital values corresponding to the phase voltages Va to Vc and the converted voltages Via to Vic are output from the A/D converter 16, and stored in random access memory (RAM) of the computational controller 17.

The computational controller 17 is equipped with a central processing unit (CPU), read-only memory (ROM), and random access memory (RAM) (none illustrated). The computational controller 17 has six input terminals. The input terminals are all connected to the output terminals of the A/D converter 16. The computational controller 17 has one output terminal. The output terminal is connected to the input terminal of the display 18. The computational controller 17 has one input/output terminal. The input/output terminal is connected to the input/output terminal of the storage 19.

The computational controller 17, by executing a program stored in ROM, realizes the functions of a power measurer 17a, a current determiner 17b, a Fourier coefficient acquirer 17c, a phase acquirer 17d, a voltage/current verifier 17e, and a current/current verifier 17f.

The power measurer 17a measures, for each phase, the value of the AC power supplied to the load via the power lines La to Lc connected to each phase of the three-phase, four-wire power source. The power measurer 17a measures the AC power as follows.

The power measurer 17a acquires the phase voltages Va to Vc output from the A/D converter 16, and stores the values of the phase voltages Va to Vc in RAM.

The power measurer 17a acquires the values of the phase voltages Va to Vc stored in RAM for a fixed period, such as one cycle of the AC power supplied by the three-phase, four-wire power source, for example, and computes an effective value for each of the phase voltages Va to Vc. The power measurer 17a stores the computed effective values in RAM. Every time the power measurer 17a computes an effective value for each of the phase voltages Va to Vc, the power measurer 17a updates the effective values stored in RAM.

The power measurer 17a acquires the values of the converted voltages Via to Vic output from the A/D converter 16, references conversion coefficients stored in ROM in advance, and converts the values of the converted voltages Via to Vic into the values of the phase currents Ia to Ic.

The power measurer 17a acquires the values of the phase currents Ia to Ic stored in RAM for a fixed period, such as one cycle of the AC power supplied by the three-phase, four-wire power source, for example, and computes an effective value for each of the phase currents Ia to Ic. The power measurer 17a stores the computed effective values in RAM. Every time the power measurer 17a computes an effective value for each of the phase currents Ia to Ic, the power measurer 17a updates the effective values stored in RAM.

As an example, FIG. 2A illustrates the effective value of each of the phase currents Ia to Ic computed by the power measurer 17a for the case in which typical utility equipment is connected as the load. FIG. 2A illustrates the effective value of each of the phase currents Ia to Ic computed by the power measurer 17a for the case in which the current transformer 12a is placed in the correct orientation on the power line La, the current transformer 12b is placed in the correct orientation on the power line Lb, and the current transformer 12c is placed in the correct orientation on the power line Lc.

In the case in which there is little fluctuation among the phase voltages Va to Vc supplied from the three-phase, four-wire power source to the load, and the phase voltages Va to Vc are within a range treated as uniform, the power measurer 17a computes 6.7 (A) as the effective value of the phase current Ia, 6.4 (A) as the effective value of the phase current Ib, and 6.5 (A) as the effective value of the phase current Ic, for example.

In the case in which there is a fluctuation in the phase voltage Va supplied from the three-phase, four-wire power source to the load, and the phase voltage Va is 10% greater than the phase voltages Vb and Vc (the phase voltage Vb and the phase voltage Vc are within a range treated as uniform), the power measurer 17a computes 8.7 (A) as the effective value of the phase current Ia, 6.5 (A) as the effective value of the phase current Ib, and 5.8 (A) as the effective value of the phase current Ic, for example.

In the case in which there is a fluctuation in the phase voltage Va supplied from the three-phase, four-wire power source to the load, and the phase voltage Va is 10% smaller than the phase voltages Vb and Vc (the phase voltage Vb and the phase voltage Vc are within a range treated as uniform), the power measurer 17a computes 2.8 (A) as the effective value of the phase current Ia, 11.2 (A) as the effective value of the phase current Ib, and 10.8 (A) as the effective value of the phase current Ic, for example.

The power measurer 17a illustrated in FIG. 1 multiplies the phase voltages Va to Vc and the phase currents Ia to Ic acquired at the same timings, and sums the multiplied values over a fixed period T, such as one cycle of the AC power supplied by the three-phase, four-wire power source, for example, to compute the values Pa to Pc of the AC power supplied to the load (see Math. 1), which are stored in RAM. Every time the power measurer 17a computes the values Pa to Pc of the AC power, the power measurer 17a updates the values of the AC power stored in RAM.

(Math. 1)

$$Pm = \frac{1}{T}\sum_{0}^{\frac{T}{\Delta t}} Vm(k) \times Im(k)$$

Formula. 1 where m is a, b, c

The current determiner 17b determines whether or not all of the effective values of the phase currents Ia to Ic are equal to or greater than a predetermined threshold.

The current determiner 17b acquires the most recent effective values of the phase currents Ia to Ic from RAM. The current determiner 17b compares the most recent effective values of the phase currents Ia to Ic to a threshold stored in advance in RAM, for example, and determines whether or not all of the effective values of the phase currents Ia to Ic are equal to or greater than the threshold.

If the current determiner 17b determines that at least one of the effective values of the phase currents Ia to Ic is less than the threshold, there is a possibility that the determination of whether or not the current transformers 12a to 12c are misplaced may not be conducted correctly, and thus the current determiner 17b acquires the most recent effective values of the phase currents Ia to Ic until determining that all of the effective values of the phase currents Ia to Ic are equal to or greater than the threshold.

When the effective values of the phase currents Ia to Ic are the values illustrated in FIG. 2A, for example, and the threshold is 2 amperes, for example, the current determiner 17b determines that all of the effective values of the phase currents Ia to Ic are equal to or greater than the threshold.

After the current determiner 17b determines that all of the effective values of the phase currents Ia to Ic are equal to or greater than the threshold, the Fourier coefficient acquirer 17c computes, from the phase voltages Va to Vc measured for each phase by the voltage measuring instrument 14, the Fourier coefficients of the fundamental of each of the phase voltages Va to Vc, which are required to determine whether or not the current transformers 12a to 12c are misplaced.

The Fourier coefficient acquirer 17c computes the Fourier coefficient a1(Va) of the fundamental of the phase voltage Va as follows.

The Fourier coefficient acquirer 17c acquires from RAM the value of the phase voltage Va stored in association with times going back from the present time over a time period corresponding to, for example, two cycles of the AC power supplied by the three-phase, four-wire power source.

In addition, from a value table stored in ROM in advance that associates a natural number k with the value of sin (natural number $k \times 2\pi\Delta t/T$), the Fourier coefficient acquirer 17c acquires the value of sin(0), which is the value when the natural number k is 0. Herein, the natural number k is a value from 0 to $T/\Delta t$. The value T represents the period of the AC power supplied by the three-phase, four-wire power source, while the value $\Delta t$ represents the sampling period of the A/D converter 16.

The Fourier coefficient acquirer 17c computes the multiplicative product of the acquired value of the phase voltage Va and the acquired value of sin(0).

Next, the Fourier coefficient acquirer 17c acquires from RAM the value of the phase voltage Va stored at the next timing after the timing at which the acquired value of the phase voltage Va was stored.

In addition, the Fourier coefficient acquirer 17c acquires from the value table the value of sin(1×2πΔt/T), which is the value when the natural number k is 1.

The Fourier coefficient acquirer 17c computes the multiplicative product of the acquired value of the phase voltage Va and the acquired value of sin(1×2πΔt/T). Subsequently, the Fourier coefficient acquirer 17c computes the sum of the product just computed and the product computed previously.

The Fourier coefficient acquirer 17c executes this process until the natural number k reaches T/Δt, or in other words, over one cycle of the AC power supplied by the three-phase, four-wire power source, until the value of the phase voltage Va is acquired. After execution, the Fourier coefficient acquirer 17c multiplies the sum over one cycle of the AC power supplied by the three-phase, four-wire power source by 2Δt/T to compute the Fourier coefficient a1(Va).

Similarly, when computing the Fourier coefficient a1(Vb) of the fundamental of the phase voltage Vb, the Fourier coefficient acquirer 17c acquires the value of the phase voltage Vb from RAM, acquires the value of sin(natural number k×2πΔt/T) from ROM, and executes the process discussed above. Also, when computing the Fourier coefficient a1 (Vc) of the fundamental of the phase voltage Vc, the Fourier coefficient acquirer 17c acquires the value of the phase voltage Vc from RAM, acquires the value of sin (natural number k×2πΔt/T) from ROM, and executes the process discussed above.

In other words, the Fourier coefficient acquirer 17c substitutes each value into Math. 2 to compute the Fourier coefficients a1(Va), a1(Vb), and a1(Vc).

(Math. 2)

$$a1(Vm) = \frac{2\Delta t}{T} \sum_{0}^{\frac{T}{\Delta t}} Vm(k) \times \sin\left(k \times \frac{2\pi\Delta t}{T}\right)$$

Formula. 2 where m is a, b, c

Similarly, the Fourier coefficient acquirer 17c substitutes each value into Math. 3 to compute a Fourier coefficient b1(Va) of the fundamental of the phase voltage Va, a Fourier coefficient b1(Vb) of the fundamental of the phase voltage Vb, and a Fourier coefficient b1(Vc) of the fundamental of the phase voltage Vc.

(Math. 3)

$$b1(Vm) = \frac{2\Delta t}{T} \sum_{0}^{\frac{T}{\Delta t}} Vm(k) \times \cos\left(k \times \frac{2\pi\Delta t}{T}\right)$$

Formula. 3 where m is a, b, c

Note that the Fourier coefficient acquirer 17c acquires the value of cos(natural number k×2πΔt/T) substituted into Math. 3 from a value table stored in ROM in advance that associates the natural number k with the value of cos(natural number k×2πΔt/T).

In addition, after the current determiner 17b determines that all of the effective values of the phase currents Ia to Ic are equal to or greater than the threshold, the Fourier coefficient acquirer 17c computes, from the phase currents Ia to Ic measured for each phase by the current measuring instrument 15, the Fourier coefficients of the fundamental of each of the phase currents Ia to Ic, which are required to determine whether or not the current transformers 12a to 12c are misplaced.

The Fourier coefficient acquirer 17c computes the Fourier coefficient a1(Ia) of the fundamental wave component of the phase current Ia as follows.

The Fourier coefficient acquirer 17c acquires from RAM the value of the phase current Ia associated with times going back from the present time over a time period corresponding to, for example, one cycle of the AC power supplied by the three-phase, four-wire power source.

In addition, the Fourier coefficient acquirer 17c acquires from the value table the value of sin(0), which is the value when the natural number k is 0.

The Fourier coefficient acquirer 17c computes the multiplicative product of the acquired value of the phase current Ia and the acquired value of sin(0).

Next, the Fourier coefficient acquirer 17c acquires from RAM the value of the phase current Ia stored at the next timing after the timing at which the acquired value of the phase current Ia was stored.

In addition, the Fourier coefficient acquirer 17c acquires from the value table the value of sin(1×2πΔt/T), which is the value when the natural number k is 1.

The Fourier coefficient acquirer 17c computes the multiplicative product of the acquired value of the phase current Ia and the acquired value of sin(1×2πΔt/T). Subsequently, the Fourier coefficient acquirer 17c computes the sum of the product just computed and the product computed previously.

The Fourier coefficient acquirer 17c executes this process until the natural number k reaches T/Δt, or in other words, over one cycle of the AC power supplied by the three-phase, four-wire power source, until the value of the phase current Ia is acquired. After execution, the Fourier coefficient acquirer 17c multiplies the sum over one cycle of the AC power supplied by the three-phase, four-wire power source by 2Δt/T to compute the Fourier coefficient a1(Ia).

Similarly, when computing the Fourier coefficient a1(Ib) of the fundamental of the phase current Ib, the Fourier coefficient acquirer 17c acquires the value of the phase current Ib from RAM, acquires the value of sin(natural number k×2πΔt/T) from ROM, and executes the process discussed above. Also, when computing the Fourier coefficient a1(Ic) of the fundamental of the phase current Ic, the Fourier coefficient acquirer 17c acquires the value of the phase current Ic from RAM, acquires the value of sin(natural number k×2πΔt/T) from ROM, and executes the process discussed above.

In other words, the Fourier coefficient acquirer 17c substitutes each value into Math. 4 to compute a Fourier coefficient a1(Ia) of the fundamental of the phase current Ia, a Fourier coefficient a1(Ib) of the fundamental of the phase current Ib, and a Fourier coefficient a1(Ic) of the fundamental of the phase current Ic.

(Math. 4)

$$a1(Im) = \frac{2\Delta t}{T} \sum_{0}^{\frac{T}{\Delta t}} Im(k) \times \sin\left(k \times \frac{2\pi\Delta t}{T}\right)$$

Formula. 4 where m is a, b, c

Similarly, the Fourier coefficient acquirer 17c substitutes each value into Math. 5 to compute a Fourier coefficient b1(Ia) of the fundamental of the phase current Ia, a Fourier coefficient b1(Ib) of the fundamental of the phase current Ib, and a Fourier coefficient b1(Ic) of the fundamental of the phase current Ic.

(Math. 5)

$$b1(Im) = \frac{2\Delta t}{T} \sum_{0}^{\frac{T}{\Delta t}} Im(k) \times \cos\left(k \times \frac{2\pi \Delta t}{T}\right)$$ Formula. 5 where m is a, b, c

From the Fourier coefficients a1 and b1 of the fundamental frequencies of the phase voltages Va to Vc computed for each phase by the Fourier coefficient acquirer 17c, the phase acquirer 17d computes the phase of the fundamental of each of the phase voltages Va to Vc.

The phase acquirer 17d substitutes each value into Math. 6 to compute the phases φ(Va) to φ(Vc) of the fundamental of each of the phase voltages Va to Vc.

(Math. 6)

$$\phi(Vm) = \tan^{-1} \frac{a1(Vm)}{b1(Vm)}$$ Formula. 6 where m is a, b, c

For example, from the Fourier coefficients a1(Va) and b1(Va) of the fundamental of the phase voltage Va computed for each phase by the Fourier coefficient acquirer 17c, the phase acquirer 17d computes the phase φ(Va) of the fundamental of the phase voltage Va.

From the Fourier coefficients a1 and b1 of the fundamental frequencies of the phase currents Ia to Ic computed for each phase by the Fourier coefficient acquirer 17c, the phase acquirer 17d computes the phase of the fundamental of each of the phase currents Ia to Ic.

The phase acquirer 17d substitutes each value into Math. 7 to compute the phases φ(Ia) to φ(Ic) of the fundamental of each of the phase currents Ia to Ic.

(Math. 7)

$$\phi(Im) = \tan^{-1} \frac{a1(Im)}{b1(Im)}$$ Formula. 7 where m is a, b, c

For example, from the Fourier coefficients a1(Ia) and b1(Ia) of the fundamental of the phase current Ia computed for each phase by the Fourier coefficient acquirer 17c, the phase acquirer 17d computes the phase φ(Ia) of the fundamental of the phase current Ia.

The phase acquirer 17d stores in RAM the phases φ(Va) to φ(Vc) of the fundamental of each of the phase voltages Va to Vc, as well as the phases φ(Ia) to φ(Ic) of the fundamental of each of the phase currents Ia to Ic.

From the phases φ(Va) to φ(Vc) of the fundamental of each of the phase voltages Va to Vc computed by the phase acquirer 17d, as well as the phases φ(Ia) to φ(Ic) of the fundamental of each of the phase currents Ia to Ic computed by the phase acquirer 17d, the voltage/current verifier 17e computes, for each phase, the phase difference of the fundamental between the phase voltage and the phase current.

The voltage/current verifier 17e acquires the phase φ(Va) of the fundamental of the phase voltage Va and the phase φ(Ia) of the fundamental of the phase current Ia from RAM, subtracts the phase φ(Va) of the fundamental of the phase voltage Va from the phase φ(Ia) of the fundamental of the phase current Ia, and computes the phase difference of the fundamental between the phase voltage Va and the phase current Ia.

The voltage/current verifier 17e acquires the phase φ(Vb) of the fundamental of the phase voltage Vb and the phase φ(Ib) of the fundamental of the phase current Ib from RAM, subtracts the phase φ(Vb) of the fundamental of the phase voltage Vb from the phase φ(Ib) of the fundamental of the phase current Ib, and computes the phase difference of the fundamental between the phase voltage Vb and the phase current Ib.

The voltage/current verifier 17e acquires the phase φ(Vc) of the fundamental of the phase voltage Vc and the phase φ(Ic) of the fundamental of the phase current Ic from RAM, subtracts the phase φ(Vc) of the fundamental of the phase voltage Vc from the phase φ(Ic) of the fundamental of the phase current Ic, and computes the phase difference of the fundamental between the phase voltage Vc and the phase current Ic for each phase.

As an example, FIG. 2B illustrates the respective phase differences computed by the voltage/current verifier 17e in the case in which typical utility equipment is connected as the load. FIG. 2B illustrates the respective phase differences computed by the voltage/current verifier 17e for the case in which the current transformer 12a is placed in the correct orientation on the power line La, the current transformer 12b is placed in the correct orientation on the power line Lb, and the current transformer 12c is placed in the correct orientation on the power line Lc.

In the case in which there is little fluctuation among the phase voltages Va to Vc supplied from the three-phase, four-wire power source to the load, and the phase voltages Va to Vc are within a range treated as uniform, the voltage/current verifier 17e computes −8.9 (°) as the phase difference of the fundamental between the phase voltage Va and the phase current Ia, −9.7 (°) as the phase difference of the fundamental between the phase voltage Vb and the phase current Ib, and −6.8 (°) as the phase difference of the fundamental between the phase voltage Vc and the phase current Ic.

In the case in which there is a fluctuation in the phase voltage Va supplied from the three-phase, four-wire power source to the load, and the phase voltages Va is 10% greater than the phase voltages Vb and Vc (the phase voltage Vb and the phase voltage Vc are within a range treated as uniform), the voltage/current verifier 17e computes −6.2 (°) as the phase difference of the fundamental between the phase voltage Va and the phase current Ia, −40.6 (°) as the phase difference of the fundamental between the phase voltage Vb and the phase current Ib, and 29.9 (°) as the phase difference of the fundamental between the phase voltage Vc and the phase current Ic.

In the case in which there is a fluctuation in the phase voltage Va supplied from the three-phase, four-wire power source to the load, and the phase voltages Va is 10% smaller than the phase voltages Vb and Vc (the phase voltage Vb and the phase voltage Vc are within a range treated as uniform), the voltage/current verifier 17e computes 33.9 (°) as the phase difference of the fundamental between the phase voltage Va and the phase current Ia, 15.3 (°) as the phase difference of the fundamental between the phase voltage Vb and the phase current Ib, and −37.9 (°) as the phase difference of the fundamental between the phase voltage Vc and the phase current Ic.

Subsequently, the voltage/current verifier 17e determines whether or not all of the computed phase differences are within a preset range. If the voltage/current verifier 17e determines that all of the computed phase differences are within the set range, the voltage/current verifier 17e determines conformity of the placement of the current transformers 12a to 12c at the present time. If the voltage/current verifier 17e determines that any of the computed phase differences are outside the set range, the voltage/current verifier 17e determines that the placement of the current transformers 12a to 12c is incorrect (misplacement).

The set range is stored in advance in RAM, for example. The set range is predetermined from the maximum value and the minimum value of the phase difference that varies according to the power factor of the load connected to the three-phase, four-wire power source (the phase difference of the fundamental between the phase voltage and the phase current).

Figure 3:
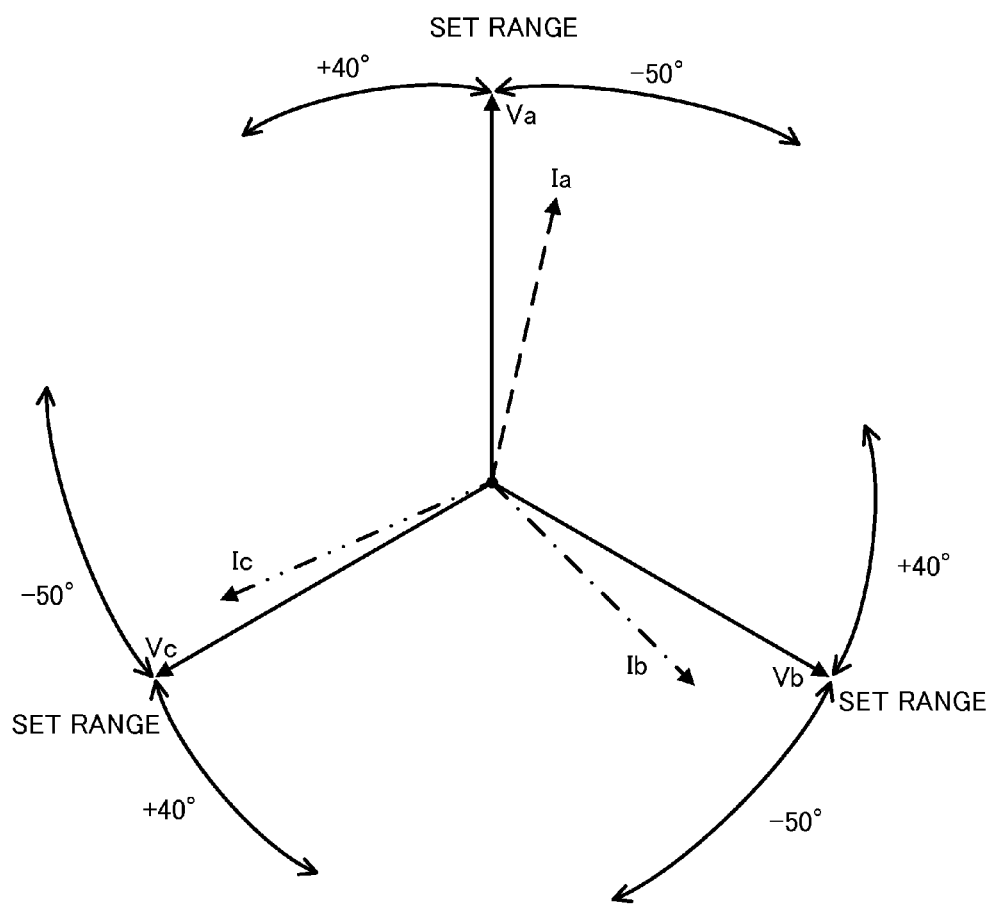
FIG. 3 is a diagram illustrating a relationship between phase voltage and phase current, and a set range.

When the current transformers 12a to 12c are placed in the correct orientation on the power lines La to Lc, respectively, and a load that produces the phase differences illustrated in FIG. 2B is connected to the three-phase, four-wire power source, the set range is decided as a range from an upper limit of +40° to a lower limit of −50°, as illustrated in FIG. 3, for example.

When there is no fluctuation among the phase voltages Va to Vc (the phase voltages Va to Vc are within a range treated as uniform), and the set range is the range illustrated in FIG. 3, for example, if the current transformer 12a is placed on the power line La in the correct orientation, the voltage/current verifier 17e determines that the phase difference is within the set range (conformity), as illustrated in FIG. 4A. When the current transformer 12a is not placed on the power line La in the correct orientation, the voltage/current verifier 17e determines that the phase difference is outside the set range (the current transformer 12a is misplaced).

When there is no fluctuation among the phase voltages Va to Vc, and the set range is the range illustrated in FIG. 3, for example, if the current transformer 12b is placed on the power line Lb in the correct orientation, the voltage/current verifier 17e determines that the phase difference is within the set range (conformity), as illustrated in FIG. 4B. When the current transformer 12b is not placed on the power line Lb in the correct orientation, the voltage/current verifier 17e determines that the phase difference is outside the set range (the current transformer 12b is misplaced).

When there is no fluctuation among the phase voltages Va to Vc, and the set range is the range illustrated in FIG. 3, for example, if the current transformer 12c is placed on the power line Lc in the correct orientation, the voltage/current verifier 17e determines that the phase difference is within the set range (conformity), as illustrated in FIG. 4C. When the current transformer 12c is not placed on the power line Lc in the correct orientation, the voltage/current verifier 17e determines that the voltage phase difference is outside the set range (the current transformer 12c is misplaced).

In addition, when there is a fluctuation in the phase voltage Va, the phase voltage Va is 10% greater than the phase voltages Vb and Vc (the phase voltages Vb and Vc are within a range treated as uniform), and the set range is the range illustrated in FIG. 3, for example, if the current transformer 12a is placed on the power line La in the correct orientation, the voltage/current verifier 17e determines that the phase difference is within the set range (conformity), as illustrated in FIG. 5A. When the current transformer 12a is placed on the power line Lb or the power line Lc in the correct orientation, or when the current transformer 12a is placed on the power line La in the reverse orientation, the voltage/current verifier 17e determines that the phase difference is outside the set range (the current transformer 12a is misplaced). However, when the current transformer 12a is placed on the power line Lb or the power line Lc in the reverse orientation, the voltage/current verifier 17e determines that the phase difference is within the set range (conformity).

In addition, when there is a fluctuation in the phase voltage Va, the phase voltage Va is 10% greater than the phase voltages Vb and Vc (the phase voltages Vb and Vc are within a range treated as uniform), and the set range is the range illustrated in FIG. 3, for example, if the current transformer 12b is placed on the power line Lb in the correct orientation, the voltage/current verifier 17e determines that the phase difference is within the set range (conformity), as illustrated in FIG. 5B. When the current transformer 12b is not placed on the power line Lb in the correct orientation, the voltage/current verifier 17e determines that the phase difference is outside the set range (the current transformer 12b is misplaced).

In addition, when there is a fluctuation in the phase voltage Va, the phase voltage Va is 10% greater than the phase voltages Vb and Vc (the phase voltages Vb and Vc are within a range treated as uniform), and the set range is the range illustrated in FIG. 3, for example, if the current transformer 12c is placed on the power line Lc in the correct orientation, the voltage/current verifier 17e determines that the phase difference is within the set range (conformity), as illustrated in FIG. 5C. When the current transformer 12c is not placed on the power line Lc in the correct orientation, the voltage/current verifier 17e determines that the phase difference is outside the set range (the current transformer 12c is misplaced).

As discussed above, when the phase voltage Va is 10% greater than the phase voltages Vb and Vc, if the current transformer 12a is placed on either the power line Lb or the power line Lc in the reverse orientation, the voltage/current verifier 17e determines that the phase difference is within the set range, as illustrated in FIG. 5A. In other words, the voltage/current verifier 17e is unable to determine misplacement.

However, when the current transformer 12a is placed on the power line Lb in the reverse orientation, as long as the current transformer 12b is not placed on the power line Lb in the correct orientation, the voltage/current verifier 17e does not determine that the phase difference is within the set range (that is, determines misplacement). For this reason, if the current transformer 12b is placed on the power line Lb in the correct orientation so the voltage/current verifier 17e determines that the phase difference is within the set range, the current transformer 12a and the current transformer 12b are placed on the power line Lb. For this reason, the user notices that the current transformer 12a is misplaced.

Similarly, when the current transformer 12a is placed on the power line Lc in the reverse orientation, as long as the current transformer 12c is not placed on the power line Lc in the correct orientation, the voltage/current verifier 17e does not determine that the phase difference is within the set range (that is, determines misplacement). For this reason, if the current transformer 12c is placed on the power line Lc in the correct orientation so the voltage/current verifier 17e determines that the phase difference is within the set range, the current transformer 12a and the current transformer 12c are placed on the power line Lc. For this reason, the user notices that the current transformer 12a is misplaced.

In addition, when there is a fluctuation in the phase voltage Va, the phase voltage Va is 10% smaller than the phase voltages Vb and Vc (the phase voltages Vb and Vc are within a range treated as uniform), and the set range is the range illustrated in FIG. 3, for example, if the current transformer 12a is placed on the power line La in the correct orientation, the voltage/current verifier 17e determines that the phase difference is within the set range (conformity), as illustrated in FIG. 6A. When the current transformer 12a is not placed on the power line La in the correct orientation, the voltage/current verifier 17e determines that the phase difference is outside the set range (the current transformer 12a is misplaced).

In addition, when there is a fluctuation in the phase voltage Va, the phase voltage Va is 10% smaller than the phase voltages Vb and Vc (the phase voltages Vb and Vc are within a range treated as uniform), and the set range is the range illustrated in FIG. 3, for example, if the current transformer 12b is placed on the power line Lb in the correct orientation, the voltage/current verifier 17e determines that the phase difference is within the set range (conformity), as illustrated in FIG. 6B. When the current transformer 12b is placed on the power line La or the power line Lc in the correct orientation, or when the current transformer 12b is placed on the power line Lb in the reverse orientation, the voltage/current verifier 17e determines that the phase difference is outside the set range (the current transformer 12b is misplaced). However, when the current transformer 12b is placed on the power line La or the power line Lc in the reverse orientation, the voltage/current verifier 17e determines that the phase difference is within the set range (conformity).

In addition, when there is a fluctuation in the phase voltage Va, the phase voltage Va is 10% smaller than the phase voltages Vb and Vc (the phase voltages Vb and Vc are within a range treated as uniform), and the set range is the range illustrated in FIG. 3, for example, if the current transformer 12c is placed on the power line Lc in the correct orientation, the voltage/current verifier 17e determines that the phase difference is within the set range (conformity), as illustrated in FIG. 6C. When the current transformer 12c is placed on the power line La or the power line Lb in the correct orientation, or when the current transformer 12c is placed on the power line La or the power line Lc in the reverse orientation, the voltage/current verifier 17e determines that the phase difference is outside the set range (the current transformer 12c is misplaced). However, when the current transformer 12c is placed on the power line Lb in the reverse orientation, the voltage/current verifier 17e determines that the phase difference is within the set range (conformity).

As discussed above, when the phase voltage Va is 10% smaller than the phase voltages Vb and Vc, if the current transformer 12b is placed on either the power line La or the power line Lc in the reverse orientation, the voltage/current verifier 17e determines that the phase difference is within the set range, as illustrated in FIG. 6B. In other words, the voltage/current verifier 17e is unable to determine misplacement.

However, when the current transformer 12b is placed on the power line La in the reverse orientation, as long as the current transformer 12a is not placed on the power line La in the correct orientation, the voltage/current verifier 17e does not determine that the phase difference is within the set range (that is, determines misplacement). For this reason, if the current transformer 12a is placed on the power line La in the correct orientation so the voltage/current verifier 17e determines that the phase difference is within the set range, the current transformer 12a and the current transformer 12b are placed on the power line La. For this reason, the user notices that the current transformer 12b is misplaced.

In addition, when the current transformer 12b is placed on the power line Lc in the reverse orientation, as long as the current transformer 12c is not placed on the power line Lc in the correct orientation, or the current transformer 12c is not placed on the power line Lb in the reverse orientation, the voltage/current verifier 17e does not determine that the phase difference is within the set range (that is, determines misplacement). For this reason, if the current transformer 12c is placed on the power line Lc in the correct orientation so the voltage/current verifier 17e determines that the phase difference is within the set range, the current transformer 12b and the current transformer 12c are placed on the power line Lc. For this reason, the user notices that the current transformer 12b is misplaced.

However, when the current transformer 12b is placed on the power line Lc in the reverse orientation, if the current transformer 12c is placed on the power line Lb in the reverse orientation, the current transformer 12b and the current transformer 12c are not placed on the same power line. Thus, the user does not notice the misplacement. At this point, the voltage/current verifier 17e determines that all phase differences are within the set range, as illustrated in FIGS. 6A to 6C.

Figure 7:
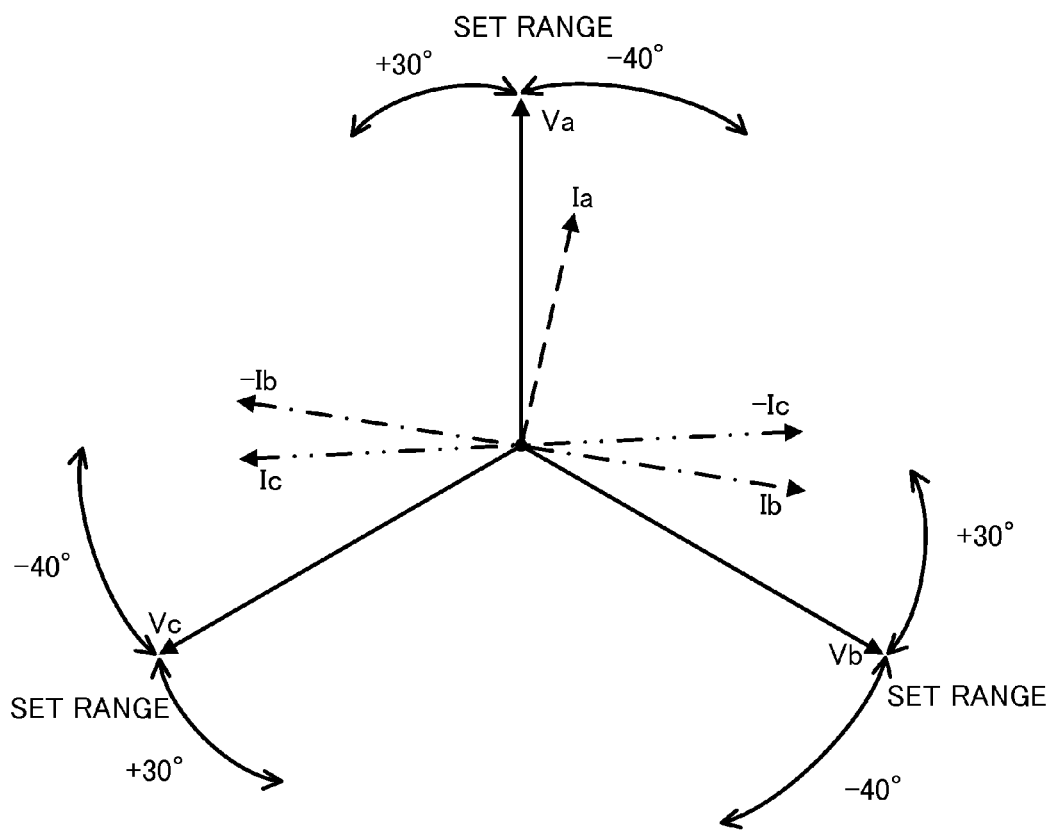
FIG. 7 is a diagram illustrating a set range, and the relationship between phase voltage and phase current when a current transformer is misplaced in the reverse orientation on a power line.

As a method of making the voltage/current verifier 17e determine misplacement when the current transformer 12b is placed in the power line Lc in the reverse orientation and the current transformer 12c is placed on the power line Lb in the reverse orientation (the current transformer 12a is placed on the power line La in the correct orientation) as discussed above, there is a method of the user adjusting the upper limit and the lower limit of the set range, as illustrated in FIG. 7, for example.

This method is a method in which the upper limit of the set range is adjusted to a value (for example, +30°) between the phase difference computed by the voltage/current verifier 17e when the current transformer 12b is placed on the power line Lc in the reverse orientation (the phase difference of the fundamental between the phase voltage Vb and the phase current −Ic), and the phase difference computed by the voltage/current verifier 17e when the current transformer 12b is placed on the power line Lb in the correct orientation (the phase difference of the fundamental between the phase voltage Vb and the phase current Ib).

Also, this method is a method in which the lower limit of the set range is adjusted to a value (for example, −40°) between the phase difference computed by the voltage/current verifier 17e when the current transformer 12c is placed on the power line Lb in the reverse orientation (the phase difference of the fundamental between the phase voltage Vb and the phase current −Ib), and the phase difference computed by the voltage/current verifier 17e when the current transformer 12c is placed on the power line Lc in the correct orientation (the phase difference of the fundamental between the phase voltage Vb and the phase current Ic).

However, as illustrated in FIG. 7, the phase difference of the fundamental between the phase voltage Vb and the phase current −Ic, and the phase difference of the fundamental between the phase voltage Vb and the phase current Ib, differ by approximately several degrees. Also, the phase difference of the fundamental between the phase voltage Vb and the phase current −Ib, and the phase difference of the fundamental between the phase voltage Vb and the phase current Ic, differ by approximately several degrees.

Thus, when the power factor of the load connected to the three-phase, four-wire power source fluctuates, there is a possibility that the phase difference computed by the voltage/current verifier 17e when the current transformer 12b is placed on the power line Lc in the reverse orientation (the phase difference of the fundamental between the phase voltage Vb and the phase current −Ic), and the phase difference computed by the voltage/current verifier 17e when the current transformer 12c is placed on the power line Lb in the reverse orientation (the phase difference of the fundamental between the phase voltage Vb and the phase current −Ib), are within the set range.

Consequently, when the upper limit of the set range and the lower limit of the set range are adjusted, if the current transformer 12b is placed in the power line Lc in the reverse orientation and the current transformer 12c is placed on the power line Lb in the reverse orientation (the current transformer 12a is placed on the power line La in the correct orientation), there is a possibility of the voltage/current verifier 17e being unable to determine misplacement.

To address this issue, the current/current verifier 17f is provided.

The current/current verifier 17f computes the phase difference between the phase currents Ia to Ic from the phases $\phi(Ia)$ to $\phi(Ic)$ of the fundamental of the phase currents Ia to Ic computed for each phase by the phase acquirer 17d.

The current/current verifier 17f acquires the phase $\phi(Ia)$ of the fundamental of the phase current Ia and the phase $\phi(Ib)$ of the fundamental of the phase current Ib from RAM, and computes the phase difference between the phase $\phi(Ia)$ of the fundamental of the phase current Ia and the phase $\phi(Ib)$ of the fundamental of the phase current Ib.

The current/current verifier 17f acquires the phase $\phi(Ib)$ of the fundamental of the phase current Ib and the phase $\phi(Ic)$ of the fundamental of the phase current Ic from RAM, and computes the phase difference between the phase $\phi(Ib)$ of the fundamental of the phase current Ib and the phase $\phi(Ic)$ of the fundamental of the phase current Ic.

The current/current verifier 17f acquires the phase $\phi(Ic)$ of the fundamental of the phase current Ic and the phase $\phi(Ia)$ of the fundamental of the phase current Ia from RAM, and computes the phase difference between the phase $\phi(Ic)$ of the fundamental of the phase current Ic and the phase $\phi(Ia)$ of the fundamental of the phase current Ia.

Subsequently, the current/current verifier 17f determines whether or not all of the computed phase differences are less than 180°. In the case of a three-phase, four-wire power source, the phase differences between the phase currents Ia to Ic are in principle less than 180°. Thus, if the current/current verifier 17f determines that all of the computed phase differences are less than 180°, the current/current verifier 17f determines conformity of the placement of the current transformers 12a to 12c. If the current/current verifier 17f determines that any of the computed phase differences are equal to or more than 180°, the current/current verifier 17f determines that the placement of the current transformers 12a to 12c is incorrect (misplacement).

When the current transformers 12a to 12c are placed in the power lines La to Lc in the correct orientation, the current/current verifier 17f computes 138.6 (°) as the phase difference of the fundamental between the phase current Ia and the phase current Ib, 173.2 (°) as the phase difference of the fundamental between the phase current Ib and the phase current Ic, and 48.2 (°) as the phase difference of the fundamental between the phase current Ic and the phase current Ia, as illustrated in FIG. 8, for example. Thus, the current/current verifier 17f determines that all of the computed phase differences are less than 180°, and determines conformity.

When the current transformer 12b is placed on the power line Lc in the reverse orientation and the current transformer 12c is placed on the power line Lb in the reverse orientation (the current transformer 12a is placed on the power line La in the correct orientation), the current/current verifier 17f computes 131.8 (°) as the phase difference of the fundamental between the phase current Ia and the phase current Ib, 186.8 (°) as the phase difference of the fundamental between the phase current Ib and the phase current Ic, and 41.4 (°) as the phase difference of the fundamental between the phase current Ic and the phase current Ia, as illustrated in FIG. 8, for example. Thus, the current/current verifier 17f determines that the phase difference of the fundamental between the phase current Ib and the phase current Ic is equal to or more than 180°, and determines misplacement.

The display 18 illustrated in FIG. 1 includes a seven-segment light-emitting diode (LED), for example. If both the voltage/current verifier 17e and the current/current verifier 17f do not determine conformity, the display 18 displays (reports) information indicating that the current transformers 12a to 12c are incorrectly placed on the power lines La to Lc. Meanwhile, if the voltage/current verifier 17e and the current/current verifier 17f both determine conformity, the display 18 displays for each phase the value of the AC power supplied to the load, as computed by the power measurer 17a.

The storage 19 is flash memory for backing up data. The storage 19 stores effective values of the phase voltages Va to Vc, the effective values of the phase currents Ia to Ic, and the values of the AC power for each phase supplied to the load, as computed by the power measurer 17a.

If the voltage terminals 11a to 11d of the power measuring device 10 discussed above are correctly connected to the power lines La to Ld, respectively, and a start instruction is received from the user, the computational controller 17 of the power measuring device 10 starts the placement determination process of FIG. 9 to determine whether or not the placement of the current transformers 12a to 12c is correct.

The computational controller 17 (current determiner 17b) acquires the most recent effective values of the phase currents Ia to Ic from RAM (step S1).

The computational controller 17 (current determiner 17b) compares the most recent effective values of the phase currents Ia to Ic to a threshold stored in advance in RAM, for example, and determines whether or not all of the effective values of the phase currents Ia to Ic are equal to or greater than the threshold (step S2).

If the computational controller 17 (current determiner 17b) determines that any of the effective values of the phase currents Ia to Ic are less than a threshold (step S2: No), there is a possibility that the determination of whether or not the current transformers 12a to 12c are misplaced may not be correctly conducted, and thus the process returns to step S2. In other words, the computational controller 17 (current determiner 17b) acquires the most recent effective values of the phase currents Ia to Ic until determining that all of the effective values of the phase currents Ia to Ic are equal to or greater than the threshold.

If the computational controller 17 (current determiner 17b) determines that all of the effective values of the phase currents Ia to Ic are equal to or greater than the threshold (step S2: Yes), the computational controller 17 (Fourier coefficient acquirer 17c) computes the Fourier coefficients a1 and b1 of the fundamental of each of the phase voltages Va to Vc, which are required to determine whether or not the current transformers 12a to 12c are misplaced (step S3).

In addition, the computational controller 17 (Fourier coefficient acquirer 17c) computes the Fourier coefficients a1 and b1 of the fundamental of each of the phase currents Ia to Ic, which are required to determine whether or not the current transformers 12a to 12c are misplaced (step S3).

After that, the computational controller 17 (phase acquirer 17d) computes, from the Fourier coefficients a1 and b1 of the fundamental of each of the phase voltages Va to Vc, the phases $\phi(Va)$ to $\phi(Vc)$ of the fundamental of each of the phase voltages Va to Vc (step S4).

In addition, the computational controller 17 (phase acquirer 17d) computes, from the Fourier coefficients a1 and b1 of the fundamental of each of the phase currents Ia to Ic, the phases $\phi(Ia)$ to $\phi(Ic)$ of the fundamental of each of the phase currents Ia to Ic (step S4).

From the phases $\phi(Va)$ to $\phi(Vc)$ of the fundamental of each of the phase voltages Va to Vc and the phases $\phi(Ia)$ to $\phi(Ic)$ of the fundamental of each of the phase currents Ia to Ic, the computational controller 17 (voltage/current verifier 17e) computes the phase difference of the fundamental between the phase voltage and the phase current for each phase (step S5).

The computational controller 17 (voltage/current verifier 17e) determines whether or not all of the phase differences computed for each phase are within a set range (step S6).

If even one of the phase differences computed for each phase exceeds the set range (step S6: No), the computational controller 17 (voltage/current verifier 17e) displays on the display 18 information indicating that the current transformers 12a to 12c are incorrectly placed on the power lines La to Lc (step S9), and the placement determination process ends.

In the case of determining that all of the phase differences computed for each phase are within the set range (step S6: Yes), the computational controller 17 (voltage/current verifier 17e) determines conformity at the present time. If the computational controller 17 (voltage/current verifier 17e) determines conformity, the computational controller 17 (current/current verifier 17f) computes, from the phases $\phi(Ia)$ to $\phi(Ic)$ of the fundamental of each of the phase currents Ia to Ic, the phase difference of the fundamental between the phase current Ia and the phase current Ib, the phase difference of the fundamental between the phase current Ib and the phase current Ic, and the phase difference of the fundamental between the phase current Ic and the phase current Ia (step S7).

The computational controller 17 (current/current verifier 17f) determines whether or not all of the computed phase differences are less than 180° (step S8).

If even one of the computed phase differences is equal to or more than 180° (step S8: No), the computational controller 17 (current/current verifier 17f) displays on the display 18 information indicating that the current transformers 12a to 12c are incorrectly placed on the power lines La to Lc (step S9), and the placement determination process ends.

In the case of determining that all of the computed phase differences are less than 180° (step S8: Yes), the computational controller 17 (current/current verifier 17f) determines conformity, and displays on the display 18 information indicating that the current transformers 12a to 12c are correctly placed on the power lines La to Lc (step S10), and the placement determination process ends.

If both the voltage/current verifier 17e and the current/current verifier 17f determine conformity (step S8: Yes), the computational controller 17 reads out the values of the AC power for each phase supplied to the load (the values of the AC power for each phase measured by the power measurer 17a) from RAM, and displays the values on the display 18.

As discussed above, the computational controller 17 determines whether or not the phase differences of the fundamental between the phase voltages Va to Vc and the phase currents Ia to Ic are within a set range, and additionally determines whether or not the phase differences between the phase currents Ia to Ic are less than 180°.

Subsequently, if both the voltage/current verifier 17e and the current/current verifier 17f do not determine conformity (if either the voltage/current verifier 17e or the current/current verifier 17f determines misplacement), the computational controller 17 reports that the current transformers 12a to 12c are incorrectly placed on the power lines La to Lc.

Thus, according to the power measuring device 10 of the present embodiment, if the current transformers 12a to 12c are incorrectly placed on the power lines La to Lc, misplacement is determined, even if there is an imbalance in the phase voltages Va to Vc measured via the voltage terminals 11a to 11d correctly connected to the power lines La to Ld because of an imbalance in the phase voltages supplied from the three-phase, four-wire power source, for example.

The computational controller 17 computes, from the Fourier coefficients a1 and b1 of the fundamental of the phase voltages Va to Vc, the phases $\phi(Va)$ to $\phi(Vc)$ of the fundamental of the phase voltages Va to Vc. Also, the computational controller 17 computes, from the Fourier coefficients a1 and b1 of the fundamental of the phase currents Ia to Ic, the phases $\phi(Ia)$ to $\phi(Ic)$ of the fundamental of the phase currents Ia to Ic.

Thus, compared to a device that detects the zero-crossing times of the phase voltages Va to Vc and computes the phases of the phase currents Ia to Ic using the zero-crossing times as a reference, the configuration of the power measuring device 10 is simple, without requiring a means and process of detecting the zero-crossing times of the phase voltages Va to Vc.

The foregoing thus describes embodiments of the present disclosure, but the present disclosure is not limited to the above embodiments, and various modifications and applications are possible.

For example, the power measuring device 10 discussed above acquires the values of the phase voltages Va to Vc stored in RAM for one cycle of the AC power supplied by the three-phase, four-wire power source, and computes the effective value of each of the phase voltages Va to Vc and the phases $\phi(Va)$ to $\phi(Vc)$ of the fundamental of the phase voltages.

In addition, the power measuring device 10 discussed above acquires the values of the phase currents Ia to Ic stored in RAM for one cycle of the AC power supplied by the three-phase, four-wire power source, and computes the effective value of each of the phase currents Ia to Ic and the phases $\phi(Ia)$ to $\phi(Ic)$ of the fundamental of the phase currents. However, the configuration is not limited to the above.

The power measuring device 10 may also be configured to compute the effective values of the phase voltages Va to Vc, the phases $\phi(Va)$ to $\phi(Vc)$ of the fundamental of the phase voltages, the effective values of the phase currents Ia to Ic, and the phases $\phi(Ia)$ to $\phi(Ic)$ of the fundamental of the phase currents from the values of the phase voltages Va to Vc and the values of the phase currents Ia to Ic over several cycles of the AC power supplied by the three-phase, four-wire power source, for example, or over a fixed period such as one second, for example.

According to this configuration, the power measuring device 10 is able to compute the phases φ(Va) to φ(Vc) of the fundamental of the phase voltages Va to Vc and the phases φ(Ia) to φ(Ic) of the fundamental of the phase currents Ia to Ic, with little effect from noise.

In addition, the power measuring device 10 discussed above compares all of the effective values of the phase currents Ia to Ic to a threshold, and in the case of determining that all of the effective values of the phase currents Ia to Ic are equal to or greater than the threshold, computes the Fourier coefficients a1 and b1 of the fundamental of the phase voltages Va to Vc and the Fourier coefficients a1 and b1 of the fundamental of the phase currents Ia to Ic. However, the configuration is not limited to the above.

The power measuring device 10 may also compare all of the maximum values of the phase currents Ia to Ic to a reference value, and in the case of determining that all of the maximum values of the phase currents Ia to Ic are equal to or greater than the reference value, compute the Fourier coefficients a1 and b1 of the fundamental of the phase voltages Va to Vc and the Fourier coefficients a1 and b1 of the fundamental of the phase currents Ia to Ic, for example.

In addition, in the power measuring device 10 discussed above, if both the voltage/current verifier 17e and the current/current verifier 17f determine conformity, the values of the AC power for each phase supplied to the load (the values of the AC power for each phase computed by the power measurer 17a) are read out from RAM and displayed on the display 18, but the configuration is not limited to the above.

If both the voltage/current verifier 17e and the current/current verifier 17f determine conformity, the power measuring device 10 may also read out the value of the AC power for each phase supplied to the load (the values of the AC power for each phase computed by the power measurer 17a) from RAM, and output the values to an external device (for example, a portable personal computer).

Also, if both the voltage/current verifier 17e and the current/current verifier 17f determine conformity, the power measuring device 10 may also read out the value of the AC power for each phase supplied to the load (the values of the AC power for each phase computed by the power measurer 17a) from RAM, and output audio indicating the values from a speaker provided in the power measuring device 10.

Note that in the foregoing embodiments, a program to be executed by the computational controller 17 may be stored and distributed on a non-transitory computer-readable recording medium such as a flexible disk, a Compact Disc-Read-Only Memory (CD-ROM), a Digital Versatile Disc (DVD), or a magneto-optical disc (MO), so that a power measuring device that executes the process illustrated in FIG. 9 is constituted by installing the program on a computer or the like.

Also, the above program may be stored in a disk device or the like included in a designated server device on a communication network such as the Internet, in which the program is modulated onto a carrier wave and downloaded or the like, for example.

Also, in the case in which the process illustrated in FIG. 9 discussed above is realized under the supervision of an operating system (OS), realized by cooperative action between an OS and an application, or the like, it is possible for only the portions other than the OS to be stored and distributed on a medium, or alternatively, downloaded or the like.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

The invention claimed is:

1. A determining device comprising:
    a voltage measuring instrument configured to measure phase voltages applied to power lines configured to transmit alternating current power supplied from a three-phase alternating current power source;
    a current measuring instrument configured to measure phase currents flowing through the power lines, via current transformers placed on outer circumferences of the power lines;
    a phase acquirer configured to compute, for each phase, a phase of phase voltage and a phase of phase current from the phase voltages measured by the voltage measuring instrument and the phase currents measured by the current measuring instrument;
    a voltage/current verifier configured to compute, for each phase, a phase difference between phase voltage and phase current from the phase of phase voltage and the phase of phase current computed for each phase by the phase acquirer, and determine conformity if all of the computed phase differences are within a preset range;
    a current/current verifier configured to compute phase differences between phase currents from the phase of phase current computed for each phase by the phase acquirer, and determine conformity if all of the computed phase differences are less than 180° ; and
    a reporting device configured to report that the current transformer is incorrectly placed on the power line unless both the voltage/current verifier and the current/current verifier determine conformity.

2. The determining device according to claim 1, comprising:
    a coefficient acquirer configured to compute, for each phase, Fourier coefficients of a fundamental of phase voltage from the phase voltages measured by the voltage measuring instrument, and compute, for each phase, Fourier coefficients of a fundamental of phase current from the phase currents measured by the current measuring instrument, wherein
    the phase acquirer computes, for each phase, a phase of phase voltage from the Fourier coefficients of the fundamental of phase voltage computed for each phase by the coefficient acquirer, and computes a phase of phase current from the Fourier coefficients of the fundamental of phase current computed for each phase by the coefficient acquirer.

3. The determining device according to claim 2, comprising:
    a current determiner configured to determine whether or not values of the phase currents measured by the current measuring instrument are equal to or greater than a predetermined threshold, wherein when the current determiner determines that the values of the phase currents measured by the current measuring instrument are equal to or greater than the threshold, the coefficient acquirer computes, for each phase, the Fourier coefficients of the fundamental of phase voltage from the phase voltages measured by the voltage measuring instrument, and computes, for each phase, the Fourier coefficients of the fundamental of phase current from the phase currents measured by the current measuring instrument.

4. The determining device according to claim 1, wherein the voltage measuring instrument measures the phase voltages applied to the power lines via terminals connected to the power lines.

5. The determining device according to claim 1, comprising:
a power measurer configured to measure, for each phase, alternating current power supplied to a load connected to the power lines, based on the phase voltages measured by the voltage measuring instrument and the phase currents measured by the current measuring instrument when both the voltage/current verifier and the current/current verifier determine conformity, and output a value of the measured alternating current power.

6. A determining method comprising:
measuring phase voltages applied to power lines configured to transmit alternating current power supplied from a three-phase alternating current power source;
measuring phase currents flowing through the power lines, via current transformers disposed on outer circumferences of the power lines;
computing, for each phase, a phase of phase voltage and a phase of phase current from the phase voltages measured and the phase currents measured;
computing, for each phase, a phase difference between phase voltage and phase current from the phase of phase voltage and the phase of phase current computed for each phase, and determining conformity if all of the computed phase differences are within a preset range;
computing phase differences between phase currents from the phase of phase current computed for each phase, and determining conformity if all of the computed phase differences are less than 180°; and
reporting that the current transformer is incorrectly placed on the power line unless conformity is determined in both verifying to the phase difference between phase voltage and phase current and verifying to the phase differences between phase currents.

7. A computer-readable non-transitory recording medium that stores a program that causes a computer to realize:
a voltage measuring function configured to measure phase voltages applied to power lines configured to transmit alternating current power supplied from a three-phase alternating current power source;
a current measuring function configured to measure phase currents flowing through the power lines, via current transformers disposed on outer circumferences of the power lines;
a phase acquiring function configured to compute, for each phase, a phase of phase voltage and a phase of phase current from the phase voltages measured by the voltage measuring function and the phase currents measured by the current measuring function;
a voltage/current verifying function configured to compute, for each phase, a phase difference between phase voltage and phase current from the phase of phase voltage and the phase of phase current computed for each phase by the phase acquiring function, and determine conformity if all of the computed phase differences are within a preset range;
a current/current verifying function configured to compute phase differences between phase currents from the phase of phase current computed for each phase by the phase acquiring function, and determine conformity if all of the computed phase differences are less than 180° ; and
a reporting function configured to report that the current transformer is incorrectly placed on the power line unless both the voltage/current verifying function and the current/current verifying function determine conformity.

* * * * *